United States Patent
Mitsui

(10) Patent No.: US 8,998,689 B2
(45) Date of Patent: Apr. 7, 2015

(54) COOLING MECHANISM

(75) Inventor: Tomoyuki Mitsui, Tokyo (JP)

(73) Assignee: NEC Corporation, Tokyo (JP)

(*) Notice: Subject to any disclaimer, the term of this patent is extended or adjusted under 35 U.S.C. 154(b) by 1586 days.

(21) Appl. No.: 12/036,719

(22) Filed: Feb. 25, 2008

(65) Prior Publication Data

US 2008/0295999 A1 Dec. 4, 2008

(30) Foreign Application Priority Data

Mar. 1, 2007 (JP) .................................. 2007/51026

(51) Int. Cl.
| | | |
|---|---|---|
| H05K 5/00 | (2006.01) |
| H01L 23/467 | (2006.01) |
| H05K 7/20 | (2006.01) |
| G06F 1/20 | (2006.01) |
| H05K 5/02 | (2006.01) |

(52) U.S. Cl.
CPC ............ *H01L 23/467* (2013.01); *H05K 7/2019* (2013.01); *G06F 1/20* (2013.01); *H05K 5/0213* (2013.01); *H01L 2924/3011* (2013.01)

(58) Field of Classification Search
USPC .......................... 454/184; 361/709, 710, 695; 165/104.33; 257/721; 174/16.1; 312/236
See application file for complete search history.

(56) References Cited

U.S. PATENT DOCUMENTS

| | | | | |
|---|---|---|---|---|
| 4,068,471 A | * | 1/1978 | Simmons | 60/262 |
| 5,297,005 A | * | 3/1994 | Gourdine | 361/697 |
| 5,361,188 A | * | 11/1994 | Kondou et al. | 361/695 |
| 5,559,673 A | * | 9/1996 | Gagnon et al. | 361/695 |
| 5,572,403 A | * | 11/1996 | Mills | 361/695 |
| 5,796,580 A | * | 8/1998 | Komatsu et al. | 361/679.48 |
| 6,031,717 A | * | 2/2000 | Baddour et al. | 361/679.49 |
| 6,086,476 A | * | 7/2000 | Paquin et al. | 454/184 |
| 6,407,918 B1 | * | 6/2002 | Edmunds et al. | 361/695 |
| 6,538,881 B1 | * | 3/2003 | Jeakins et al. | 361/679.46 |
| 6,877,551 B2 | * | 4/2005 | Stoller | 165/47 |
| 7,035,103 B2 | * | 4/2006 | Araki et al. | 361/695 |
| 7,251,136 B2 | * | 7/2007 | Yang et al. | 361/695 |
| 7,701,710 B2 | * | 4/2010 | Tanaka et al. | 361/679.5 |
| 2006/0217055 A1 | * | 9/2006 | Kupferberg et al. | 454/184 |
| 2007/0030650 A1 | * | 2/2007 | Madara et al. | 361/695 |
| 2007/0178822 A1 | * | 8/2007 | Lanus et al. | 454/184 |

FOREIGN PATENT DOCUMENTS

| | | | |
|---|---|---|---|
| JP | 59-152791 U | 10/1984 | |
| JP | 292991 | * 2/1990 | ............... H05K 7/20 |
| JP | 2-92991 U | 7/1990 | |
| JP | 3080470 U | 7/2001 | |
| JP | 2005113919 A | 4/2005 | |

OTHER PUBLICATIONS

Handbook on Cooling Design of Electronic Equipment Air-cooled Packaging, Japan Society of Mechanical Engineers, ISBN4-88898-077-2 C3053, Dec. 15, 1995. pp. 2.1-22 through 2.1-17.
Japanese Office Action for JP2007-1351026 issued Oct. 12, 2011.

* cited by examiner

*Primary Examiner* — Steven B McAllister
*Assistant Examiner* — Frances H Kamps
(74) *Attorney, Agent, or Firm* — Sughrue Mion, PLLC

(57) ABSTRACT

A cooling mechanism for cooling an object includes a duct that leads a fluid for cooling, multiple fans that are placed on a channel in the duct and send forth the fluid for cooling, and a bypass channel that detours at least one of the multiple fans.

2 Claims, 8 Drawing Sheets

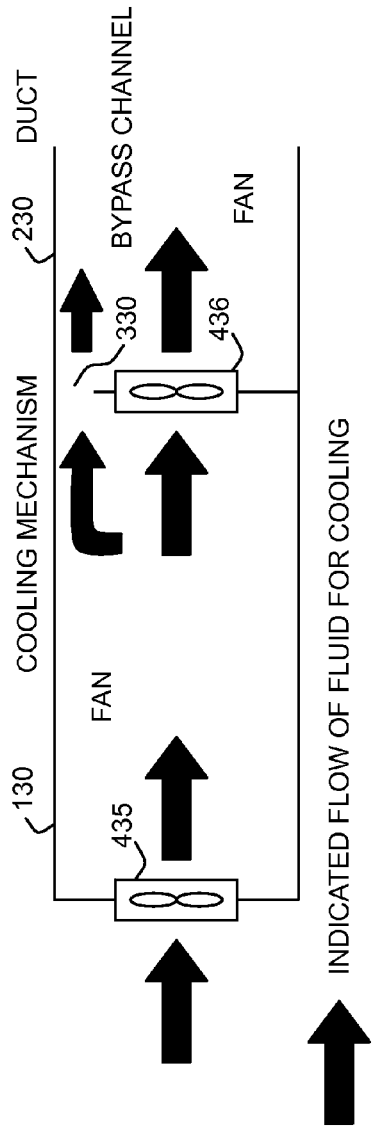
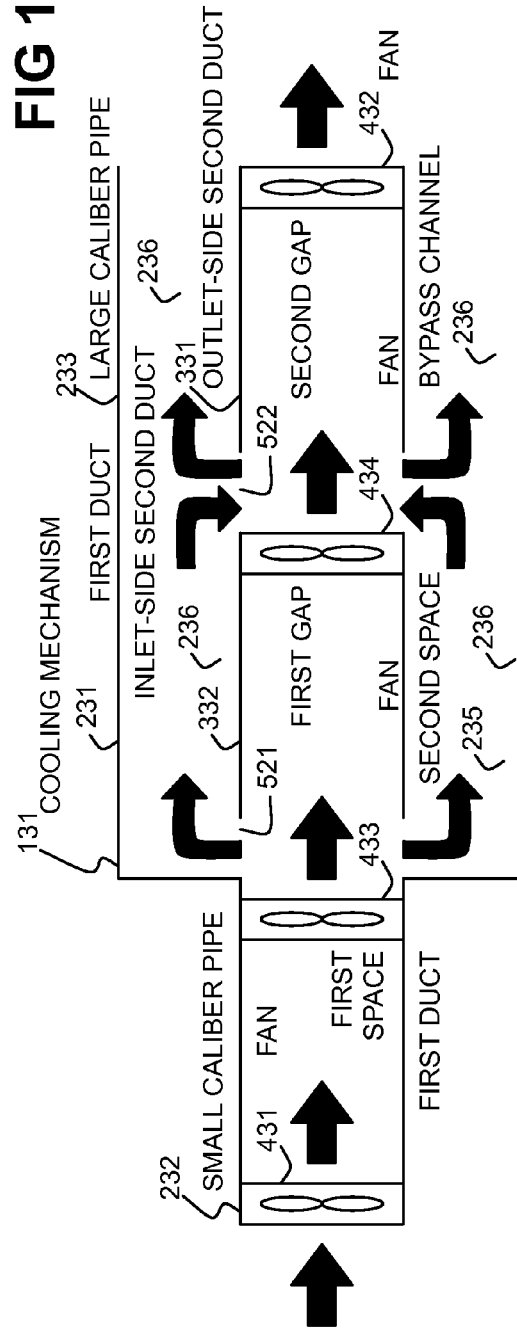

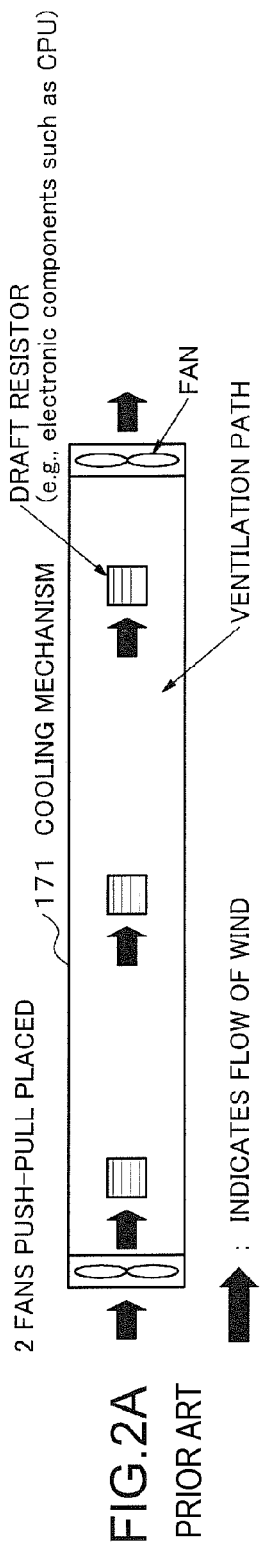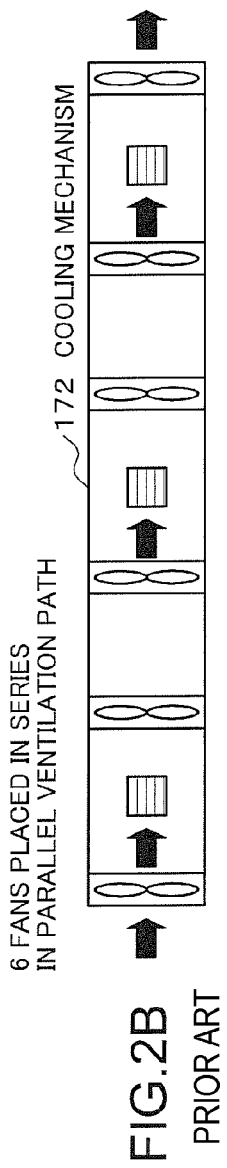

COOLING MECHANISM

This application is based upon and claims the benefit of priority from Japanese patent application No. 2007-051026, filed on Mar. 1, 2007, the disclosure of which is incorporated herein in its entirety by reference.

BACKGROUND OF THE INVENTION

1. Field of the Invention

The present invention relates to a cooling mechanism, such as a cooling mechanism of an electronic component (e.g., a CPU of a computer).

2. Description of the Related Art

For instance, when a computer is operating, an amount of heat generated by a CPU (Central Processor Unit) is large. There are the cases where a temperature rise of the CPU due to the amount of heat leads the CPU itself to a malfunction or a failure.

Therefore, in the case of the computer including such a CPU, the CPU is constantly blown on by air for cooling for instance. To be more specific, the computer includes a cooling mechanism for constantly supplying the air for cooling to the periphery of the CPU for instance.

Such a cooling mechanism includes a fan for the CPU for instance.

When there is only one fan, the CPU is thermally damaged and its operation stops in a moment when the one fan gets damaged. That time is several minutes to several hours for instance.

To cope with the above-mentioned problem, the following cooling device for the central processor unit has been proposed (Japanese Utility Model Laid-Open No. 3080470).

The cooling device of Japanese Utility Model Laid-Open No. 3080470 is the cooling device for the central processor unit including a radiation fin and at least two fans. And the at least two included fans are connected in series. And gaps are provided among the at least two fans by a few coupled columns.

Thus, in the case of absorbing a high temperature of the central processor unit, the cooling device of Japanese Utility Model Laid-Open No. 3080470 can have the radiation fin take in a large amount of wind by increasing pressure with a series double-fan. To be more specific, the cooling device of Japanese Utility Model Laid-Open No. 3080470 can increase effectiveness and speed of cooling.

Moreover, the cooling device of Japanese Utility Model Laid-Open No. 3080470 has a structure of the series double-fan. Therefore, the other fan is immediately usable when one of the fans therein breaks down.

According to the technique of the proposal (Japanese Utility Model Laid-Open No. 3080470), the cooling device of Japanese Utility Model Laid-Open No. 3080470 is provided with two or more fans. And the cooling device of Japanese Utility Model Laid-Open No. 3080470 has a configuration wherein remaining fans supply the air for cooling to the CPU when one of the fans breaks down. Therefore, the cooling device of Japanese Utility Model Laid-Open No. 3080470 has an advantage that the CPU is hardly damageable.

The following multi-bypass turbofan gas-turbine engine (Japanese Patent Laid-Open No. 2005-113919) is proposed. The technical field of the multi-bypass turbofan gas-turbine engine is totally different from that of the cooling mechanism for cooling an electronic component.

As shown in FIG. 8, multi-bypass turbofan gas-turbine engine 10 of Japanese Patent Laid-Open No. 2005-113919 includes first-stage and second-stage fans 31 and 33 which are placed at interval in an axial direction of engine fan 35 coupled to low-pressure shaft 30 in a drive-engaged state. And multi-bypass turbofan gas-turbine engine 10 includes fan bypass duct 40 surrounding second-stage fan 33. And multi-bypass turbofan gas-turbine engine 10 includes first bypass entrance 42 to fan bypass duct 40 placed between the axial directions of first-stage and second-stage fans 31 and 33. And multi-bypass turbofan gas-turbine engine 10 includes second bypass entrance 46 to fan bypass duct 40 placed between the axial directions of second-stage fan 33 and circular core engine inlet 47. And multi-bypass turbofan gas-turbine engine 10 includes first-stage fan blade 32 of first-stage fan 31 placed in an axial position leading to first-stage fan duct 131. And multi-bypass turbofan gas-turbine engine 10 includes second-stage fan blade 36 radially placed in an axial position leading to second-stage fan duct 132.

And second-stage fan duct 132 is installed behind first bypass entrance 42 in the axial direction, and is placed inside a radial direction of fan bypass duct 40. And a fan shroud 108 divides second-stage fan blade 36 into radial inner fan hub 37 and radial outer end section 39 respectively. And end section 39 is radially placed in fan end duct 146 including circular duct wall 50. And circular duct wall 50 includes unrotatable front duct wall unit 90 adjacent to the front of rotatable fan shroud 108. And axial translational deflector 44 is positioned and placed so that the deflector closes fan end duct 146 if it opens first bypass entrance 42 and opens fan end duct 146 if it closes first bypass entrance 42.

SUMMARY OF THE INVENTION

An exemplary object of the invention is to provide a technique capable of effectively cooling an object.

A cooling mechanism for cooling an object according to an exemplary aspect of the invention includes a duct that leads a fluid for cooling, multiple fans that are placed on a channel in the duct and send forth the fluid for cooling, and a bypass channel that detours at least one of the multiple fans.

A cooling mechanism for cooling an object according to an exemplary aspect of the invention includes duct means for leading a fluid for cooling, multiple fan means placed on a channel inside the first duct for sending forth the fluid for cooling, and bypass channel means for detouring at least one of the multiple fans.

BRIEF DESCRIPTION OF THE DRAWINGS

Exemplary features and advantages of the present invention will become apparent from the following detailed description when taken with the accompanying drawings in which:

FIGS. 1A and 1B are exemplary schematic diagrams of a cooling mechanism according to a first exemplary embodiment;

FIGS. 2A and 2B are schematic diagrams showing characteristics of a cooling mechanism which is not the exemplary embodiment;

FIG. 2C is an exemplary schematic diagram showing characteristics of the cooling mechanism according to a first example;

EXEMPLARY EMBODIMENTS

Figure 3:
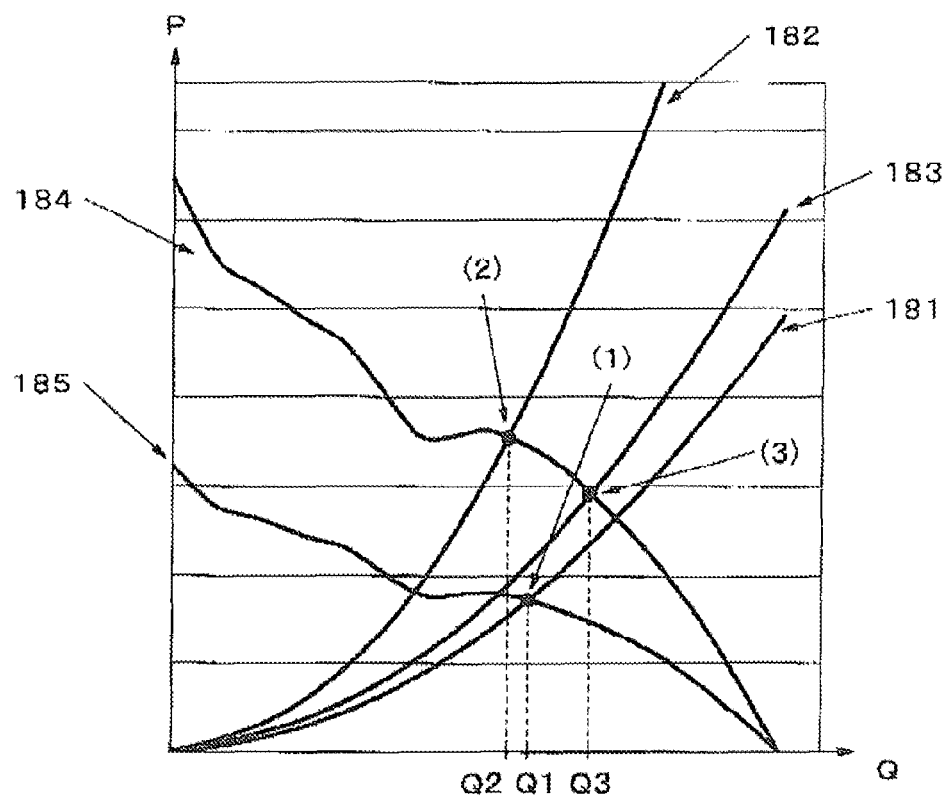
FIG. 3 is a graph showing advantages of the cooling mechanism according to the first example.

A cooling mechanism of a first exemplary embodiment is the cooling mechanism for cooling an object.

The cooling mechanism of the first exemplary embodiment is particularly the cooling mechanism for cooling an electronic component, such as a CPU.

The cooling mechanism of the first exemplary embodiment includes a first duct in order to lead a fluid for cooling (nitrogen gas, $CO_2$ gas or air for instance) to the object (electronic component such as a CPU). For instance, the first duct may be provided to have its outlet side opposed to the object (electronic component such as a CPU). For instance, the object may be inside the first duct.

Furthermore, the cooling mechanism of the first exemplary embodiment includes a second duct of a small caliber provided inside the first duct. And the first duct is provided with a fan correspondingly to an inlet side of the first duct.

Moreover, the first duct is provided with a fan correspondingly to the inlet side of the second duct. Furthermore, the second duct is provided with a fan correspondingly to an outlet side of the second duct. The fan provided correspondingly to the inlet side of the second duct of the first duct and the second duct are provided so that there is a gap between them.

Moreover, the second duct is not limited to one piece. Multiple second ducts may be further provided inside the first duct. In this case, the same fan is provided to each of the second ducts.

And the first duct and the inlet-side second duct/the outlet-side second duct are provided so that there is a gap between them respectively.

To be more specific, cooling mechanism 131 of the first exemplary embodiment discharges the fluid for cooling supplied by the fan from the inlet side of the first duct via the gap.

For instance, the first duct includes a pipe of an approximately convex cross section of which small caliber unit is connected with its large caliber unit. And the first duct has the second duct made up of the pipe of the caliber smaller than the large caliber unit of the first duct placed inside the pipe of the large caliber unit of the first duct.

Next, the first exemplary embodiment will be further described in detail with reference to the drawings.

FIG. 1A is an exemplary schematic diagram of cooling mechanism 130 of the first exemplary embodiment. FIG. 1B is an exemplary schematic diagram of cooling mechanism 131 of the first exemplary embodiment.

FIGS. 2A, 2B and 2C are diagrams for describing characteristics of cooling mechanism 173 of the first example as against cooling mechanism 171 and cooling mechanism 172 which are related arts.

FIG. 3 is a graph for describing the advantages of cooling mechanism 173 as against cooling mechanism 171 and cooling mechanism 172.

With reference to FIG. 1A, cooling mechanism 130 includes duct 230 for leading the fluid for cooling. Duct 230 might generally be called duct means.

And cooling mechanism 130 includes fans 435 and 436 which are placed on a channel (a ventilation path) inside duct 230 and send forth the fluid for cooling. Fans 435 and 436 might generally be called multiple fan means.

And cooling mechanism 130 includes bypass channel 330 which detours fan 436. Bypass channel 330 might generally be called bypass channel means.

When there is a difference in the amount of the fluid for cooling sent forth by fan 435 and that sent forth by fan 436, the fluid for cooling as the difference is flowable by way of bypass channel 330.

For instance, when the amount of the fluid for cooling sent forth by fan 435 is larger than that sent forth by fan 436, a part of the fluid for cooling sent forth by fan 435 is sent forth by fan 436. And another part of the fluid for cooling sent forth by fan 435 flows by way of bypass channel 330.

With reference to FIG. 1B, cooling mechanism 131 includes first duct 231, outlet-side second duct 331, inlet-side second duct 332, fan 431, fan 432, fan 433 and fan 434.

First duct 231 is a multistage (two-stage) pipe wherein small-caliber pipe 232 of caliber a and large-caliber pipe 233 of caliber b (a<b) are connected with an approximately convex cross section. Second duct 331 is a pipe of caliber a. A space inner small-caliber pipe 232 is called first space 234.

And outlet-side second duct 331 is placed inside large-caliber pipe 233 of first duct 231 so that its axis is collinear with the axis of small-caliber pipe 232. And outlet-side second duct 331 is placed on the outlet side (fluid discharge side) of first duct 231.

Furthermore, outlet-side second duct 331 is not connected with first duct 231. To be more specific, outlet-side second duct 331 is provided to have the inlet and the outlet of its own.

To be more specific, in the case of cooling mechanism 131, it is possible that a part of the fluid inhaled from the inlet of first duct 231 flows to outside of outlet-side second duct 331.

An electronic component (e.g., CPU) for instance which is not shown is provided opposite the outlet of outlet-side second duct 331, that is, to the right of first duct 231 (outlet-side second duct 331) in FIG. 1B. For instance, the electronic component may be inside the second duct.

Inlet-side second duct 332 is a pipe of caliber a. And inlet-side second duct 332 is placed inside large-caliber pipe 233 of first duct 231 so that its axis is collinear with the axis of outlet-side second duct 331. And inlet-side second duct 332 is placed between outlet-side second duct 331 and small-caliber pipe 232 of the first duct.

Furthermore, in the case of cooling mechanism 131, it is possible that a part of the fluid inhaled into the inlet of outlet-side second duct 331 flows in from outside of inlet-side second duct 332. And, in the case of cooling mechanism 131, it is possible that a part of the fluid inhaled from the inlet of first duct 231 flows to outside of inlet-side second duct 332. And in the case of cooling mechanism 131, it is possible that a part of the fluid inhaled from the inlet of inlet-side second duct 332 flows to outside of outlet-side second duct 331.

To be more specific, cooling mechanism 131 includes the first duct (such as first duct 231) for leading the fluid for cooling. And cooling mechanism 131 includes the second duct (such as outlet-side second duct 331 or inlet-side second duct 332) provided inside the first duct. And cooling mechanism 131 includes a first fan (such as fan 431 or fan 433) provided to the first duct. And cooling mechanism 131 includes a second fan (such as fan 432 or fan 434) provided to the second duct.

And in the case of cooling mechanism 131, the bypass channel 236 is a space (second space 235) outside the second duct(s) (such as second duct 331 and/or second duct 332) and inside the first duct (such as first duct 231).

And cooling mechanism 131 discharges the fluid for cooling supplied from the inlet side of the first duct via the bypass channel 236.

Fan 431 is a fan for intake. Fan 431 is placed at one end (the inlet side of first duct) of first duct 231 (small-caliber pipe 232). Fan 432 is a fan for exhaust. Fan 432 is placed on the outlet side (fluid discharge side) of outlet-side second duct 331. Fan 433 is placed at the opposite end of small-caliber pipe 232 of first duct 231 to the end where fan 431 is placed. To be more specific, fan 433 is placed opposite the inlet side of inlet-side second duct 332. Fan 434 is placed on the outlet side of inlet-side second duct 332, that is, opposite the inlet side of outlet-side second duct 331.

Next, characteristics of cooling mechanism 173 of the first example will be described with reference to FIGS. 1A, 1B, 2A, 2B, 2C, and 3.

Cooling mechanism 171 shown in FIG. 2A includes a multiple number of the fans 175 at both ends (inlet side and outlet side) of one pipe.

Cooling mechanism 173 shown in FIG. 2C includes six of the fans 175. Cooling mechanism 173 includes two kinds of pipes of different calibers. And cooling mechanism 173 includes the bypass channel 178. Cooling mechanism 173 is a cooling mechanism wherein the fan 175 for intake is added to each of the inlet side of outlet-side second duct 331 and the inlet side of inlet-side second duct 332 of cooling mechanism 131 of the first exemplary embodiment.

Cooling mechanism 172 shown in FIG. 2B includes six of the fans 175 as with cooling mechanism 173. However, the caliber of the pipe of cooling mechanism 172 is one kind. Therefore, cooling mechanism 172 includes no bypass channel.

As for cooling mechanism 171, when an intake ability of the inlet-side fan 175 is equal to or more than an exhaust ability of the outlet-side fan 175, the ability of cooling of the cooling mechanism depends on the fan 175 provided on the outlet side.

Therefore, cooling mechanism 171 has a problem that the fan 175 provided on the inlet side is a fan 175 of excessive ability which is wasteful. Cooling mechanism 171 also has a problem that the fan provided on the outlet side is overloaded.

As for cooling mechanism 171, when the intake ability of the inlet-side fan 175 and the exhaust ability of the outlet-side fan 175 are the same performance, such problems hardly occur. Such cooling mechanism 171 is widely used as a general push-pull double-fan.

Cooling mechanism 172 has the same problems as cooling mechanism 171. Cooling mechanism 172 further has a problem that the fan 175 provided inside may be draft resistance 174. To be more specific, cooling mechanism 172 cannot obtain performance commensurate with the multiple provided fans 175.

In comparison, as for cooling mechanism 130 shown in FIG. 1A described in the first exemplary embodiment, a problem hardly occurs even if there is a difference in performance for sending forth the fluid for cooling between fan 435 and fan 436.

Moreover, as for cooling mechanism 131 shown in FIG. 1B described in the first exemplary embodiment, a problem hardly occurs even if the intake ability of fan 431 (fan for intake) is larger than the exhaust ability of fan 432 (fan for exhaust).

To be more specific, in the case of cooling mechanism 131, the fluid inhaled over the exhaust ability is exhausted from between outlet-side second duct 331 and first duct 231. And in the case of cooling mechanism 131, it happens less often that fan 433 and fan 434 operate as significant pressure loss. Furthermore, cooling mechanism 131 can obtain locally strongly directional wind so that its cooling ability is improved.

As for the above, the same applies to cooling mechanism 173 of the first example corresponding to cooling mechanism 131 of the first exemplary embodiment.

FIG. 3 is a graph showing a relation between capacity/static pressure characteristics and system impedance of the fans. The horizontal axis is the capacity, and the vertical axis is the static pressure. Performance of the fans is indicated by the capacity/static pressure characteristics.

FIG. 3 shows the system impedance curve 181, the system impedance curve of 182 the system impedance curve 183, the capacity/static pressure characteristics of the fan (when six fans are used) 184, and the capacity/static pressure characteristics of the fan (when two fans are used) 185.

Refer to general techniques regarding air-cooling such as the capacity/static pressure characteristics described in the following document.

"Electronic Device Cooling Design Handbook" 2. 1 Air-cooled Packaging, copyright holder: Japan Society of Mechanical Engineers (publishing office: Japan Society of Mechanical Engineers, ISBN4-88898-077-2 C3053, published Dec. 15, 1995) for instance.

When there are two fans 175, the case of cooling mechanism 171, the characteristics are shown by the curve 181 in FIG. 3.

When there are six fans 175 which are in the related art (the case of cooling mechanism 172), the characteristics are shown by the curve 182 in FIG. 3.

When there are six fans 175 which are the example (the case of cooling mechanism 173), the characteristics are shown by the curve 183 in FIG. 3.

Cooling mechanism 171 has two fans 175, and so the static pressure is small as shown by the curve 181 in FIG. 3. Therefore, cooling mechanism 171 also has small capacity Q1.

In comparison, cooling mechanism 172 and cooling mechanism 173 have six fans 175 (six in series), and so maximum static pressure rises as shown by the curves 182 and 183 in FIG. 3.

In the case of cooling mechanism 172, however, the inner fan 175 becomes resistance of the ventilation path 176, and so a system impedance curve becomes sharp and capacity Q2 decreases accordingly as shown by the curve 182 in FIG. 3.

In comparison, cooling mechanism 173 includes the bypass channel 176 so that the draft resistance 174 of the entire channel lowers and the system impedance curve becomes a gentle curve as shown by the curve 183 in FIG. 3. Therefore, capacity Q3 increases.

The first exemplary embodiment includes the bypass channel 178 of the fluid for cooling so that the fluid for cooling passes through the bypass channel 178 correspondingly to performance differences of the fans. Therefore, there is an advantage that it allows effective cooling.

Next, the second exemplary embodiment will be described in detail with reference to the drawings. In describing the second exemplary embodiment, the same contents as described in the first exemplary embodiment will be omitted to the extent that the description does not become unclear.

Figure 4A:
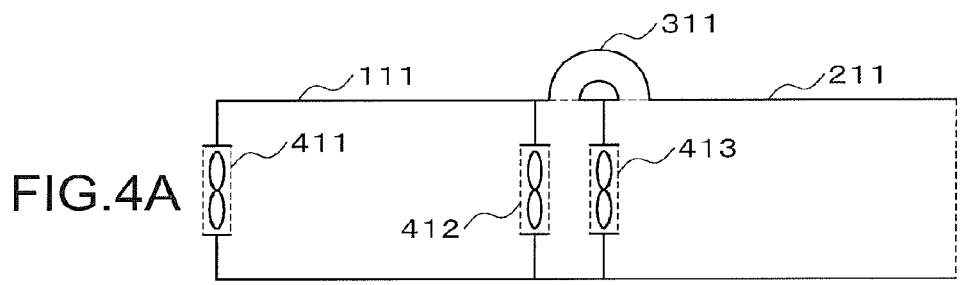
FIGS. 4A, 4B, 4C and 4D are exemplary schematic diagrams of the cooling mechanism according to a second exemplary embodiment.

With reference to FIG. 4A, cooling mechanism 111 of the second exemplary embodiment includes duct 211, bypass channel 311, fan 411, fan 412 and fan 413.

Duct 211 is a passage where the fluid for cooling flows. Duct 211 may be in any form from a simple cylindrical form or square shape for instance to a complicated form considering a cooling object and installation for instance.

Fan 411 inhales the fluid for cooling from outside and discharges it to the space surrounded by duct 211, fan 411 and fan 412.

Fan 412 inhales the fluid for cooling from the space surrounded by duct 211, fan 411 and fan 412 and discharges it to the space surrounded by duct 211, fan 412 and fan 413.

Fan 413 inhales the fluid for cooling from the space surrounded by duct 211, fan 412 and fan 413 and discharges it to the space surrounded by duct 211, fan 413 and the outlet of duct 211.

Fan 411 and fan 412 have the same performance, which are the push-pull double-fans for instance.

Bypass channel 311 connects the space surrounded by duct 211, fan 412 and fan 413 with the space surrounded by duct 211, fan 413 and the outlet of duct 211.

As for cooling mechanism 111 of the first exemplary embodiment above, when there is a difference in the performance among fan 411, fan 412 and fan 413, an amount of the fluid for cooling correspondingly to the performance difference flows by way of bypass channel 311.

Figure 4B:
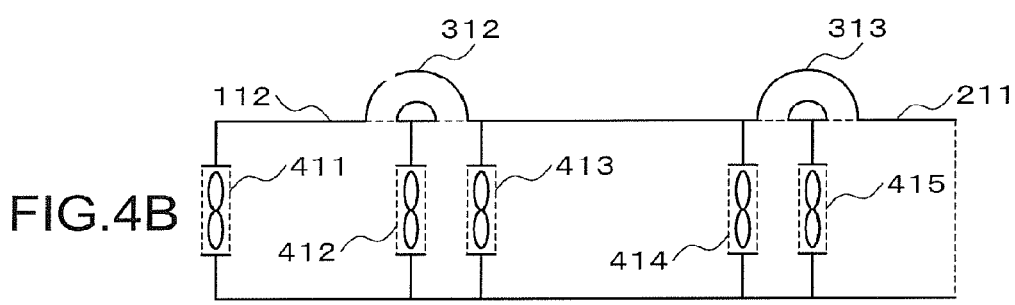

The second exemplary embodiment may take the form of FIG. 4B for instance. With reference to FIG. 4B, cooling mechanism 112 of the second exemplary embodiment includes duct 211, bypass channel 312, bypass channel 313, fan 411, fan 412, fan 413, fan 414 and fan 415.

Figure 4C:
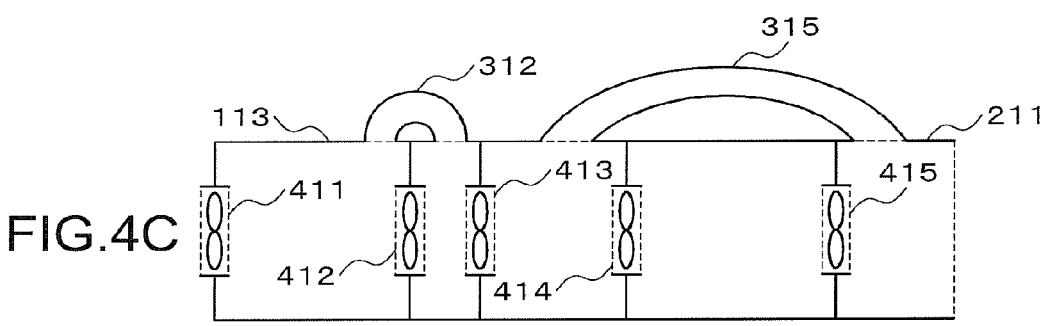

The second exemplary embodiment may take the form of FIG. 4C for instance. With reference to FIG. 4C, cooling mechanism 113 of the second exemplary embodiment includes duct 211, bypass channel 312, bypass channel 315, fan 411, fan 412, fan 413, fan 414 and fan 415.

Figure 4D:
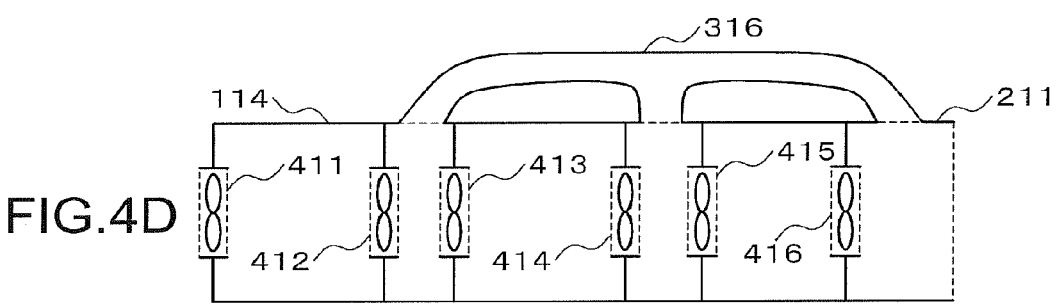

The second exemplary embodiment may take the form of FIG. 4D. With reference to FIG. 4D, cooling mechanism 114 of the second exemplary embodiment includes duct 211, bypass channel 316, fan 411, fan 412, fan 413, fan 414, fan 415 and fan 416.

Each of the elements and operation of cooling mechanism 112, cooling mechanism 113 and cooling mechanism 114 are easily comprehensible by referring to the description of each of the elements and operation of cooling mechanism 111. Therefore, a description thereof will be omitted.

The second exemplary embodiment includes the bypass channels, and detours the flow of the fluid for cooling correspondingly to the performance differences among the fans. Therefore, it can obtain the advantage that each of the fans effectively operates so as to allow effective cooling.

Next, the third exemplary embodiment will be described in detail with reference to the drawings. In describing the third exemplary embodiment, the same contents as described in the first or second exemplary embodiments will be omitted to the extent that the description does not become unclear.

Figure 5A:
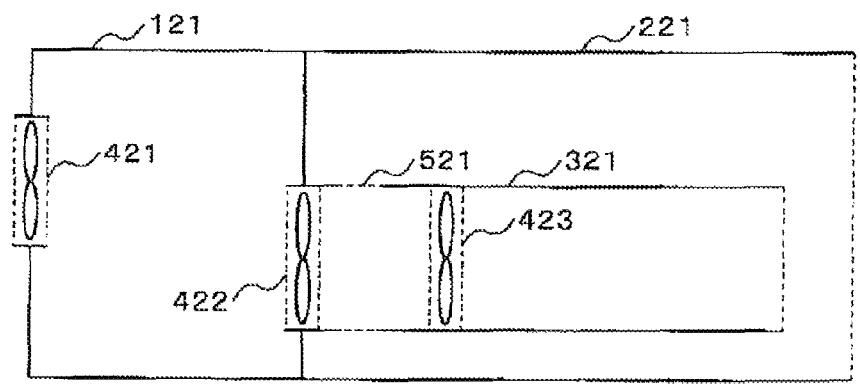
FIGS. 5A, 5B and 5C are exemplary schematic diagrams of the cooling mechanism according to a third exemplary embodiment.

With reference to FIG. 5A, cooling mechanism 121 of the third exemplary embodiment includes first duct 221, second duct 321, fan 421, fan 422 and fan 423.

Unlike cooling mechanism 131 of the first exemplary embodiment, first duct 221 of the third exemplary embodiment does not include a pipe of an approximately convex cross section of which small caliber unit is connected with its large caliber unit. To be more specific, the third exemplary embodiment indicates that the caliber of the first duct 221 may be constant.

First duct 221, fan 421 and fan 422 form closed space (hereinafter referred to as space A for convenience of description). Fan 421 inhales the fluid for cooling from outside into space A.

Fan 422 discharges the fluid for cooling from space A to the space between fan 422 and second duct 321 (hereinafter referred to as space C for convenience of description).

Second Duct 321 is installed in the space surrounded by first duct 221, fan 422 and the outlet of first duct 221 (hereinafter referred to as space B for convenience of description) so that the inlet of second duct 321 is opposed to fan 422.

Fan 423 inhales the fluid for cooling from space C into the space surrounded by second duct 321, fan 423 and the outlet of second duct 321 (hereinafter referred to as space D for convenience of description). The fluid for cooling is mutually flowable into or out between space B and space C.

As for cooling mechanism 121 of the third exemplary embodiment above, when the amount of the fluid for cooling discharged to space C is equivalent to the amount of the fluid for cooling inhaled into space D, the fluid for cooling discharged by fan 422 is inhaled by fan 423. In this case, no significant flow of the fluid for cooling is generated between space B and space C.

When the amount of the fluid for cooling discharged to space C is smaller than the amount of the fluid for cooling inhaled into space D, the fluid for cooling flows from space B into space C. When the amount of the fluid for cooling discharged to space C is larger than the amount of the fluid for cooling inhaled into space D, the fluid for cooling flows out from space C to space B.

Figure 5B:
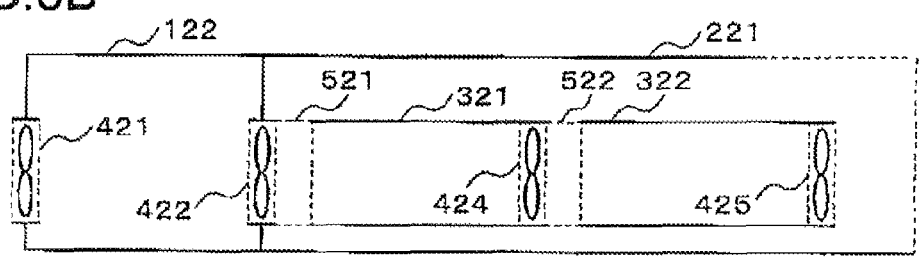

The third exemplary embodiment may take the form of FIG. 5B for instance. With reference to FIG. 5B, cooling mechanism 122 of the third exemplary embodiment includes first duct 221, second duct 321, second duct 322, fan 421, fan 422, fan 424 and fan 425.

Figure 5C:
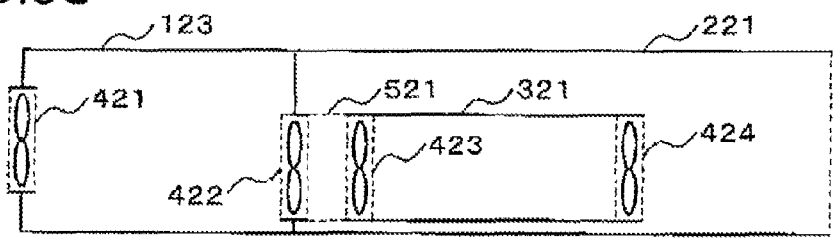

The third exemplary embodiment may take the form of FIG. 5C for instance. With reference to FIG. 5C, cooling mechanism 123 of the third exemplary embodiment includes first duct 221, second duct 321, fan 421, fan 422, fan 423 and fan 424.

Cooling mechanism 121 shown in FIG. 5A, cooling mechanism 122 shown in FIG. 5B and cooling mechanism 123 shown in FIG. 5C are exemplary embodiments wherein space A is placed on the inlet side of first duct 221 and space B is placed on the outlet side of first duct 221.

Figure 6A:
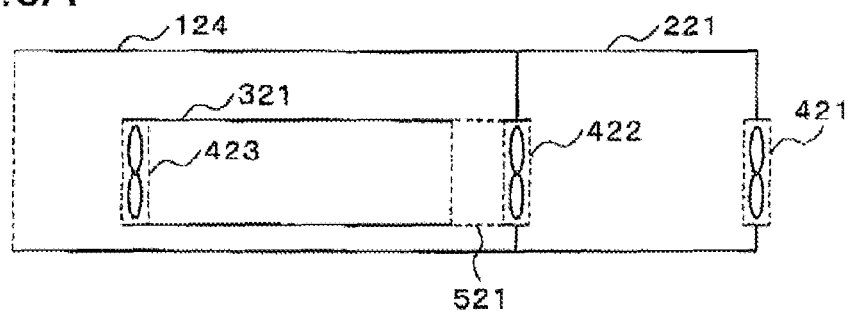
FIGS. 6A, 6B and 6C are exemplary schematic diagrams of the cooling mechanism according to the third exemplary embodiment.

The third exemplary embodiment may take the form of FIG. 6A for instance. With reference to FIG. 6A, cooling mechanism 124 of the third exemplary embodiment includes first duct 221, second duct 321, fan 421, fan 422 and fan 423

Figure 6B:
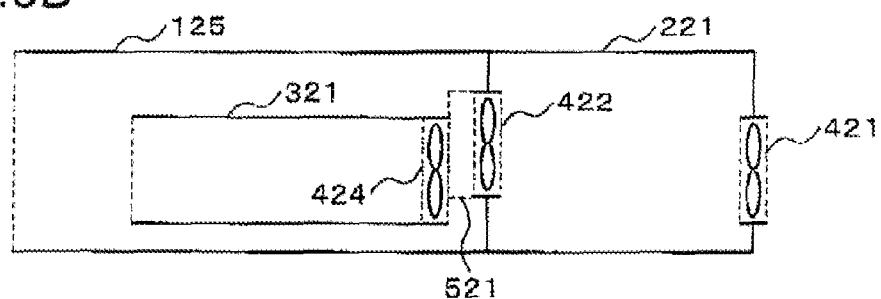

The third exemplary embodiment may take the form of FIG. 6B for instance. With reference to FIG. 6B, cooling mechanism 125 of the third exemplary embodiment includes first duct 221, second duct 321, fan 421, fan 422 and fan 424.

Figure 6C:
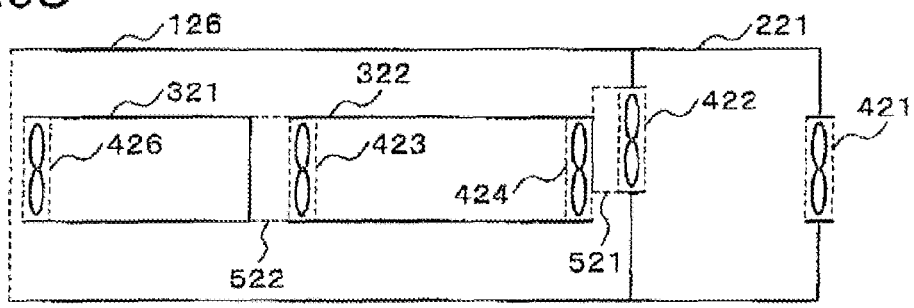

The third exemplary embodiment may take the form of FIG. 6C for instance. With reference to FIG. 6C, cooling mechanism 126 of the third exemplary embodiment includes first duct 221, second duct 321, second duct 322, fan 421, fan 422, fan 423, fan 424 and fan 426.

Cooling mechanism 124 shown in FIG. 6A, cooling mechanism 125 shown in FIG. 6B and cooling mechanism 126 shown in FIG. 6C are exemplary embodiments wherein space B is placed on the inlet side of first duct 221 and space A is placed on the outlet side of first duct 221.

Each of the elements and operation of cooling mechanism 122, cooling mechanism 123, cooling mechanism 124, cooling mechanism 125 and cooling mechanism 126 are easily comprehensible by referring to the description of each of the elements and operation of cooling mechanism 121. Therefore, a description thereof will be omitted.

In other word, the third exemplary embodiment may be described following. According to the cooling mechanism of the third exemplary embodiment, the first duct (such as first duct 221) includes first space (such as space A) and second space (such as space B) connected to the first space by an opening.

The first space includes the first fan (such as fan 421). And the second space includes the second duct (such as duct 321).

The first space is provided on the inlet-side of the second space or on the outlet-side of the second space.

The cooling mechanism of the third exemplary embodiment includes a gap between the first space and the second duct.

And the fluid for cooling is flowable into or flow out of the bypass channel (such as the space outside the second duct and inside the first duct) via the gap.

The gap between the first space and the second duct may be a first gap 521.

The second ducts may be an inlet-side second duct (such as second duct 321) provided on the inlet side of the first duct and an outlet-side second duct (such as second duct 322) provided on the outlet side of the first duct.

The cooling mechanism of the third exemplary embodiment includes a second gap 522 between the inlet-side second duct and the outlet-side second duct.

And the fluid for cooling is flowable into or flow out of the bypass channel via the second gap 522.

The first duct may be a pipe of an approximately convex cross section of which small caliber unit is connected with its large caliber unit.

The first space may be the small caliber unit, and the second space may be the large caliber unit.

As for cooling mechanism 121, cooling mechanism 122 and cooling mechanism 123 of the third exemplary embodiment, a gap is provided between the fan for exhaust of the first duct and the second duct. The gap detours the flow of the fluid for cooling to the space between the first duct and the second duct when there is a difference between the amount of the fluid for cooling discharged by the fan for exhaust of the first duct and the amount of the fluid for cooling inhaled by the second duct.

As for cooling mechanism 124, cooling mechanism 125 and cooling mechanism 126 of the third exemplary embodiment, a gap is provided between the fan for intake of the first duct and the second duct. The gap detours the flow of the fluid for cooling to the space between the first duct and the second duct when there is a difference between the amount of the fluid for cooling inhaled by the fan for intake of the first duct and the amount of the fluid for cooling discharged by the second duct.

As for cooling mechanism 122 and cooling mechanism 126 of the third exemplary embodiment, a gap is provided between the inlet-side second duct and the outlet-side second duct. The gap detours the flow of the fluid for cooling to the space between the first duct and the second duct when there is a difference between the amount of the fluid for cooling discharged by the inlet-side second duct and the amount of the fluid for cooling inhaled by the outlet-side second duct.

Therefore, the third exemplary embodiment provides an advantage that it allows effective cooling.

Next, the fourth exemplary embodiment will be described in detail with reference to the drawings. In describing the fourth exemplary embodiment, the same contents as described in the first to third exemplary embodiments will be omitted to the extent that the description does not become unclear.

Figure 7A:
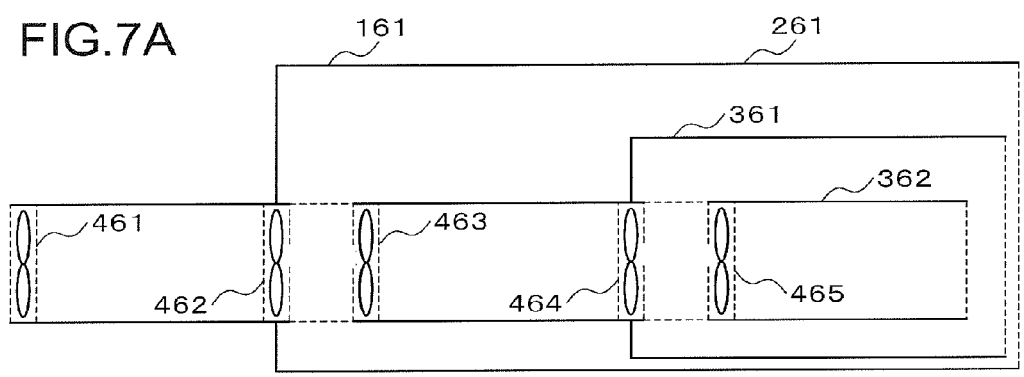
FIGS. 7A and 7B are exemplary schematic diagrams of the cooling mechanism according to a fourth exemplary embodiment.

With reference to FIG. 7A, cooling mechanism 161 of the fourth exemplary embodiment includes first duct 261, second duct 361, third duct 362, fan 461, fan 462, fan 463, fan 464 and fan 465.

First duct 261, second duct 361, fan 461, fan 462 and fan 463 are corresponding to first duct 221, second duct 321, fan 421, fan 422 and fan 423 of cooling mechanism 121 described in the third exemplary embodiment respectively. Space F, space G, space H and space J in FIG. 7A are corresponding to space A, space B, space C and space D in FIG. 5A respectively.

To be more specific, the description of first duct 261, second duct 361, fan 461, fan 462 and fan 463 will be omitted because it is similar to the description of the third exemplary embodiment.

Figure 7B:
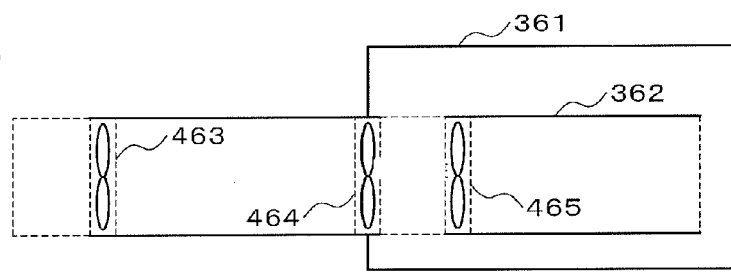
Figure 8:
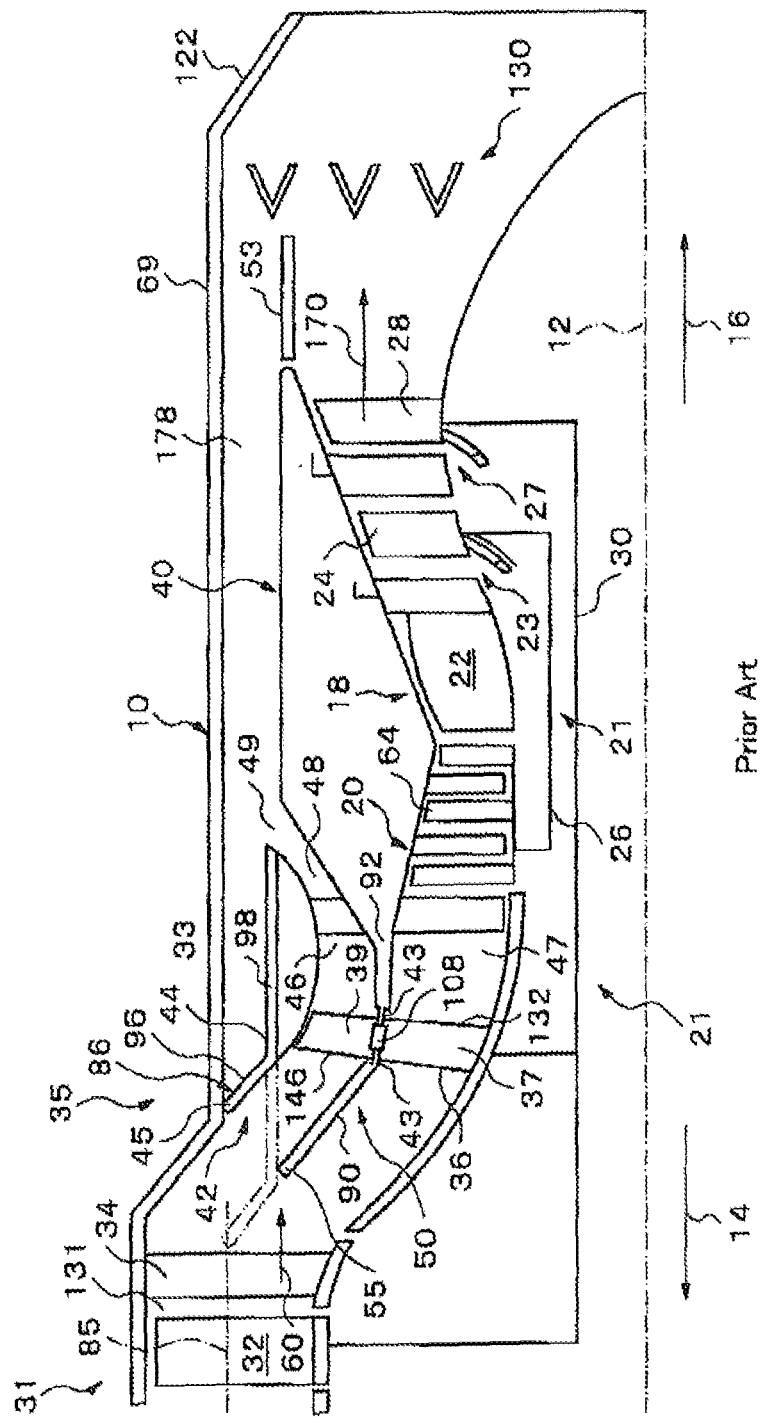
FIG. 8 is an explanatory diagram of a multi-bypass turbofan gas-turbine engine of a related art.

FIG. 7B is a diagram wherein the portions relating to second duct 361 and third duct 362 are extracted from FIG. 7A.

In FIG. 7B, second duct 361, third duct 362, fan 463, fan 464 and fan 465 are corresponding to first duct 221, second duct 321, fan 421, fan 422 and fan 423 of cooling mechanism 121 described in the third exemplary embodiment respectively.

Space J, space K, space L and space M in FIG. 7B are corresponding to space A, space B, space C and space D in FIG. 5A respectively. Space H in FIG. 7B is corresponding to the outside in the third exemplary embodiment.

To be more specific, the description of second duct 361, third duct 362, fan 463, fan 464 and fan 465 will be omitted because it is similar to the description of the third exemplary embodiment.

In other word, the fourth exemplary embodiment may be described following. The fourth exemplary embodiment includes the third duct in the second duct. And the relation between the second duct and the third duct may be the same as the relation between the first duct and the second duct.

For instance, the electronic component may be inside the third duct.

Therefore, the fourth exemplary embodiment provides an advantage that it delicately allows effective cooling.

The fourth exemplary embodiment includes an N(N is an integer which is 2 or larger)+1-th duct (such as third duct 362) provided inside an N-th duct (such as second duct 361) and having a caliber smaller than the N-th duct. And the fourth exemplary embodiment includes an N-th fan (such as fan 463 or fan 464) provided to the N-th duct. And the fourth exemplary embodiment includes an N+1-th fan (such as fan 465) provided to the N+1-th duct.

A cooling mechanism of the fifth exemplary embodiment, especially for cooling an electronic component, includes a first duct provided to have its outlet side opposed to the electronic component in order to lead a fluid for cooling to the electronic component.

And the cooling mechanism includes a second duct of a small caliber provided inside the first duct, a fan provided correspondingly to an inlet side of the first duct, a fan provided correspondingly to an outlet side of the second duct and a fan provided correspondingly to the inlet side of the second duct.

A cooling mechanism of the sixth exemplary embodiment is the cooling mechanism of the fifth exemplary embodiment, and wherein a fluid for cooling supplied by a fan from the inlet side of the first duct is dischargeable via outside of the second duct and inside of the first duct.

Especially, the first duct includes a pipe of an approximately convex cross section of which small caliber unit is connected with its large caliber unit. And the second duct made up of the pipe of the caliber smaller than the large caliber unit is placed inside the pipe of the large caliber unit of the first duct.

And a fan is provided correspondingly to the inlet side of the small caliber unit of the first duct, a fan is provided correspondingly to the outlet side of the second duct, and a fan is provided correspondingly to the outlet side of the small caliber unit of the first duct.

According to Japanese Utility Model Laid-Open No. 3080470, it is described that, even if one of the fans is damaged, the cooling device thereof can supply the cooling function because it has at least one more fan.

However, it is difficult for the cooling device of Japanese Utility Model Laid-Open No. 3080470 to supply the cooling function sufficiently.

It is because the cooling device of Japanese Utility Model Laid-Open No. 3080470 has a fan in a position far from the CPU side and a fan in a position close to the CPU side merely placed in series.

For that reason, when ability of one of the fans is higher than ability of the other fan, the cooling of the CPU depends on the ability of the fan close to the CPU. Therefore, the ability of the high-ability fan is not greatly exerted. To be more specific, that is, extra capacity goes astray and does not hit the CPU so that it is wasteful.

Here, in the case of a configuration wherein the two fans are provided on the inlet side and the outlet side of one duct for instance, the air inhaled by the fans is certainly blown out by the fans via the duct. As for the configuration, however, the ability of the fan may be wasted when the ability of one of the fans is higher than ability of the other fan. The fans alternately may also be overloaded.

Inversely, when the ability of one of the fans is higher than ability of the other fan, the air discharged by the fans depends on the ability of the fans. Therefore, the fans become overloaded or the ability of the fans is wasted.

Thus, as for the technique of Japanese Utility Model Laid-Open No. 3080470, even though multiple fans are provided, the technique is not ingenious enough to sufficiently exert the ability of the multiple fans.

Even in the case of applying the technique of an aircraft gas turbine of Japanese Patent Laid-Open No. 2005-113919 which is totally different from the cooling mechanism of the CPU, the cooling function is not fully exerted.

A first exemplary advantage according to the invention is that it can provide a technique wherein an electronic component such as a CPU is effectively cooled, the electronic component is hardly thermally damaged and durability thereof is improved.

A second exemplary advantage according to the invention is that remaining fans supply the fluid for cooling when one of the fans is damaged so that the cooling of the CPU for instance is more securely performed.

A third exemplary advantage according to the invention is that not only certainty of cooling is high but also cooling efficiency (ability) of the fans is high. To be more specific, even if the fans of different performance are used, the performance of the fans is not to be wasted. To be more specific, even if the ability of one of the fans is higher than ability of the other fans, it is not to be wasted.

A fourth exemplary advantage according to the invention is that the fans are hardly overloaded and hardly damaged.

A fifth exemplary advantage according to the invention is that directivity of the fluid for cooling to an internal object is high and cooling efficiency is good.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

Further, it is noted that the inventor's intent is to retain all equivalents of the claimed invention even if the claims are amended during prosecution.

What is claimed is:

1. A cooling mechanism for cooling an object, comprising:
a duct that leads a fluid for cooling;
multiple fans that are placed in the duct and send the fluid for cooling; and
a bypass channel that detours at least one of the multiple fans, wherein:
the duct is a first duct;
the cooling mechanism further comprising a plurality of second ducts provided inside the first duct and the multiple fans wherein
the second ducts are aligned coaxially,
a first fan of one of the multiple fans provided outside the second ducts in the first duct; and
a second fan of one of the multiple fans provided to each one of the second ducts,
the bypass channel includes space outside the second duct and inside the first duct; and
the cooling mechanism discharges the fluid for cooling supplied from an inlet side of the first duct via the bypass channel, wherein:
the first duct includes a first space and a second space connected to the first space by an opening;
the first space includes the first fan;
the second space includes the second ducts;
the first space is provided on the inlet side of the second space or the outlet side of the second space;
the cooling mechanism includes a gap between the first space and at least one of the second fans; and
the fluid for cooling is flowable into or out of the bypass channel via the gap.

2. The cooling mechanism according to claim 1, wherein:
the gap is a first gap, and
the second duct includes:
an inlet-side second duct provided on the inlet side of the first duct;
an outlet-side second duct provided on the outlet side of the first duct;
a second gap between the inlet-side second duct and the outlet-side second duct; and
the fluid for cooling is flowable into or out of the bypass channel via the second gap.

* * * * *